United States Patent [19]
Palmer

[11] 3,962,778
[45] June 15, 1976

[54] PHOTODETECTOR ARRAY AND METHOD OF MANUFACTURING SAME

[75] Inventor: John P. Palmer, Pomona, Calif.

[73] Assignee: General Dynamics Corporation, Pomona, Calif.

[22] Filed: Jan. 24, 1975

[21] Appl. No.: 543,716

Related U.S. Application Data

[60] Continuation-in-part of Ser. No. 425,429, Dec. 17, 1973, abandoned, which is a division of Ser. No. 352,777, April 19, 1973, abandoned.

[52] U.S. Cl. .................................... 29/572; 136/89; 148/186; 427/74; 427/75; 427/76; 427/109
[51] Int. Cl.² ..................... B01J 17/00; H01L 15/02
[58] Field of Search ................ 427/74, 75, 76, 109, 427/85; 29/621, 572; 338/17; 136/89; 148/186

[56] References Cited
UNITED STATES PATENTS

| | | |
|---|---|---|
| 2,765,385 | 10/1956 | Thomsen ............................ 427/74 |
| 2,879,182 | 3/1959 | Pakswer et al. ..................... 427/74 |
| 3,108,021 | 10/1963 | Stanley ............................... 427/75 |
| 3,350,775 | 11/1967 | Iles ..................................... 136/89 |
| 3,377,200 | 4/1968 | Chamberlin ........................ 427/74 |
| 3,450,568 | 6/1969 | Mann .................................. 136/89 |
| 3,703,408 | 11/1972 | Belasco et al. ..................... 427/74 |

Primary Examiner—Michael F. Esposito
Attorney, Agent, or Firm—Albert J. Miller; Edward B. Johnson

[57] ABSTRACT

Disclosed is a thin film photodetector array of resistance-variable light detectors and a method for manufacturing such an array. Electronic read-out circuitry is normally associated therewith.

7 Claims, 5 Drawing Figures

PHOTODETECTOR ARRAY AND METHOD OF MANUFACTURING SAME

CROSS-REFERENCE TO RELATED APPLICATIONS

This application is a continuation-in-part of U.S. patent application Ser. No. 425,429 filed Dec. 17, 1973 now abandoned which was a division of U.S. patent application Ser. No. 352,777 filed Apr. 19, 1973 now abandoned.

BACKGROUND OF THE INVENTION

There are many applications for optical detectors, that is detectors which can convert an optical image into an electrical analog of the optical image. Examples of systems which can utilize such detectors are surveillance devices. Fourier optics systems and data processing systems.

Conventional detectors or detector arrays used in these systems are exemplified by U.S. Pat. Nos. 2,880,119 and 2,884,507. Both of these patents disclose a photoconductive device or photocell in which a layer of photosensitizable material is depositied on an insulative base or substrate. The sensitized material is associated with a pair of electrodes which sense the photo-variable resistance therebetween. While detectors of this type have enjoyed a small degree of success, their full potential has been limited due to artificial configuration restraints and associated manufacturing difficulties and costs. Heretofore it has not been possible to consistently produce detector arrays having a predictable, uniform electrical response over the entire array with the requisite sensitivity for sophisticated systems. Since the entire region between the electrodes is photosensitive, positioning of the electrodes has been critical to uniformity of the resistance therebetween.

SUMMARY OF THE INVENTION

The present invention comprises a photodetector array in which a film or layer of photosensitizable material is deposited or otherwise affixed to a substrate of insulative material. Disposed on the photosensitizable film are at least two electrode pads. A small, precisely defined portion of the film between each pair of electrode pads is photosensitized.

DESCRIPTION OF THE PREFERRED EMBODIMENTS

Figure 1:
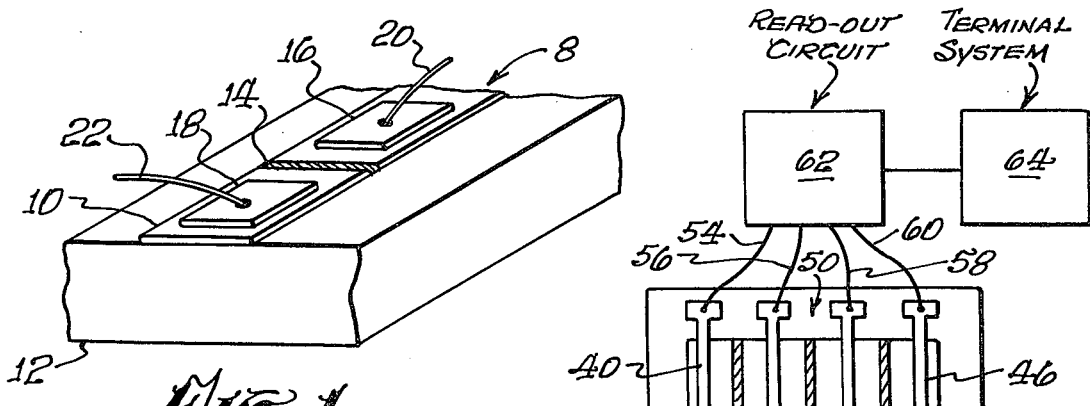
FIG. 1 is a perspective view of a single photoconductive cell of the thin film photodetector array of the present invention.

Illustrated in FIG. 1 is a single photoconductive cell 8 constructed in accordance with the present invention. A thin film or layer 10 of a photosensitizable semiconductor material is deposited on a substrate 12. The base or substrate 12 may be any electrically non-conductive material such as plate glass, ceramic or quartz while the layer 10 is any thin polycrystalline film, epitaxial film, or other semiconductor film which is capable of being sensitized as a photoconductor. The thin semiconductor film 10 which may be cadmium sulfide (CdS), about 1 micro-meter thick, for example, can easily be deposited on a glass substrate 12 by any of the known conventional techniques, such as by vacuum deposition. Materials other than CdS selected from the group II-VI compound semiconductors can be used for the thin film 10, such as cadmium selenide (CdSe), cadmium telluride (CdTe), zinc selenide (ZnSe) and zinc telluride (ZnTe), for example. In order to enhance the adherence of the CdS film 10 to the substrate, the substrate 12 may be pre-prepared by first depositing on the substrate an insulating oxide such as tin oxide ($SnO_2$) or germanium dioxide ($GeO_2$).

A preselected region 14, of a precise geometric configuration, of the thin semiconductor film 10 is sensitized or made photoconductive. This photoconductive or sensitized region 14 is illustrated by way of example as an elongated narrow band which may be produced by the diffusion of a small quantity of an impurity, such as copper, in the region 14 of the thin film 10. The introduction of an impurity greatly reduces the concentration of electrical charge carriers in the diffused region 14. As a result, the region 14 is highly sensitive to light, that is, it is sensitized, and its electrical resistivity to the flow of current is greatly increased. An example of a method for difffusing an impurity in a preselected region 14 is as follows. A metal mask, for example, one made of brass, is located in front of the thin semiconductor film 10 inside of a vacuum deposition chamber. The metal mask has an etched-through pattern corresponding to the geometry desired for the sensitive detector regions. The impurity metal such as copper, for example, is vacuum deposited, using a resistance-heated source, through the mask pattern onto the surface of the thin film 10 in precisely the desired amount. The copper may be in the form of ribbon, a length of which is selectively cut off to define an amount equivalent to about 100 micrograms, for example. The deposited copper impurity is diffused into the thin film 10 by heating to about 300° Centigrade in an air oven for about 30 minutes. As a result of the diffusion, the copper content is about 0.8 atomic percent in the cadmium sulfide.

A pair of metallic electrode pads 16 and 18 of a metal such as aluminum or indium are then vacuum deposited (as in the manner described above, for example) on the thin film 10 through a metal mask using a resistance-heated source, with one electrode pad on either side of the sensitized region 14. In the case of some metals such as aluminum the electrode pads 16 and 18 can be deposited on the film 10 prior to the impurity diffusion step because such metals and the contact formed with the metals at the interface with the film 10 do not deteriorate during heat treatment such as experienced during the photo-sensitization impurity diffusion step. Thus, in the example chosen, the copper sensitizer can be diffused into the cadmium sulfide after the aluminum electrode pads have been deposited. Electrical leads such as gold or aluminum wire 20 and 22 are ultrasonically or thermocompression bonded or otherwise electrically connected to the electrode pads 16 and 18 respectively. The light level on the cell 8 will vary the electrical resistance between the electrodes 16 and 18. Thus, the cell 8 will generate an electrical signal by causing the electrical current to vary corresponding to the magnitude of this light level.

The photoconductive region between the pair of electrode pads 16 and 18 is defined by the preselected local sensitized region 14. Hence the resistance between the pair of electrode pads 16 and 18 is dominated by the relatively high resistance of the sensitized or photoconductive region 14. Accordingly, the exact placement of the sensing electrode pads 16 and 18 is not of critical importance and reasonable changes can be tolerated without significantly degrading performance.

Figure 2:
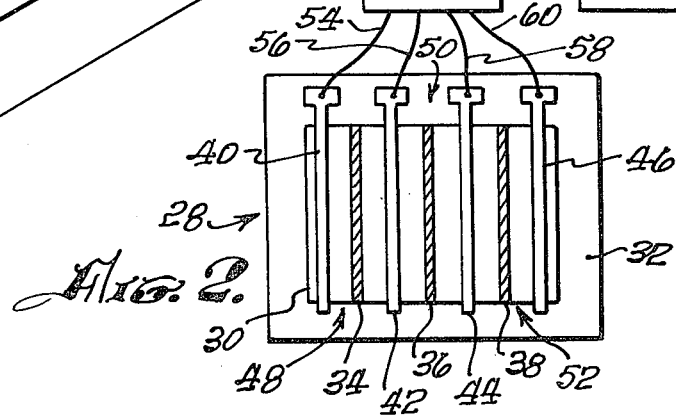
FIG. 2 is a top view of the photodetector array of the present invention.
Figure 3:
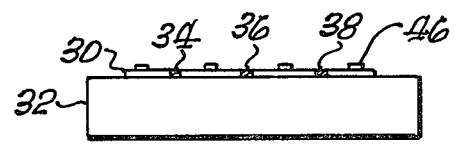
FIG. 3 is a front view of the photodetector array of FIG. 2.

FIGS. 2 and 3 illustrate a detector array 28 of a plurality of individual photoconductive cells. A thin semiconductor film 30 is deposited on a glass substrate 32 with a plurality of geometrically patterned regions 34, 36 and 38, sensitized or made photoconductive. A plurality of electrode pads 40, 42, 44 and 46 are disposed in a sensing relationship with respect to the sensitized regions 34, 36 and 38 to form the plurality of photoconductive cells 48, 50 and 52.

Individual cells 48, 50 and 52 are formed with a sensitized region between a pair of electrode pads, with the interior electrode pads 42 and 44 being common to more than one cell. Thus cell 48 is formed with sensitized region 34 between electrode pads 40 and 42, cell 50 with sensitized region 36 between electrode pads 42 and 44, and cell 52 with sensitized region 38 between electrode pads 44 and 46.

Each electrode pad 40, 42, 44 and 46 has bonded to it an electrical lead or wire 54, 56, 58 and 60 respectively. The leads 54, 56, 58 and 60 are connected to appropriate electronic read-out circuitry 62 which in turn interfaces with a terminal system 64 such as a computer, storage device, or visual display. While three cells have been shown in FIGS. 2 and 3, this has been done for purposes of illustration only and the array may include a multitude of cells. the particular array illustrated is a one-dimensional differential array, that is, it registers one dimension across an optical image.

Figure 4:
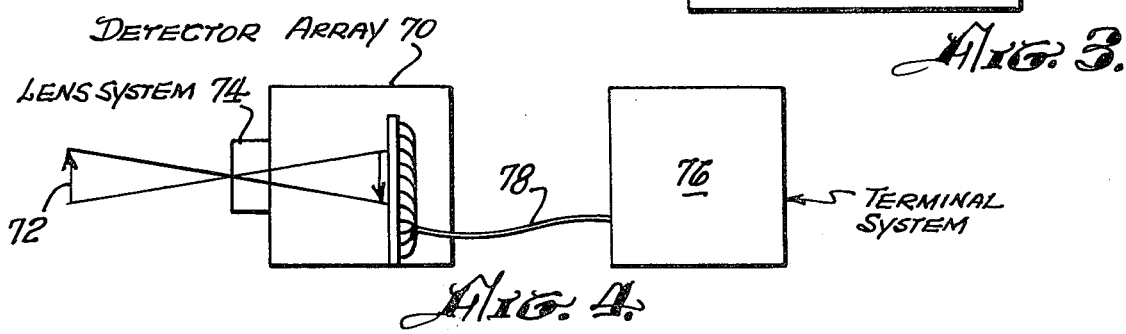
FIG. 4 is a schematic representation of a system utilizing the photodetector array of the present invention.

As illustrated in FIG. 4, the detector array 70 can be utilized to convert an optical image 72 into an electrical analog for transmission to other systems. The optical image 72 is focused onto the detector array 70 by a lens system 74. The optical image 72 focused on the detector array 70 will produce different local light intensities at the individual photoconductive cells. The electrical resistance of each of the detector cells tracks the light level at the corresponding image area to produce an electrical signal indicative of the light level. The signal can then be transmitted to a terminal system 76 for utilization therein through lead wires 78.

Figure 5:
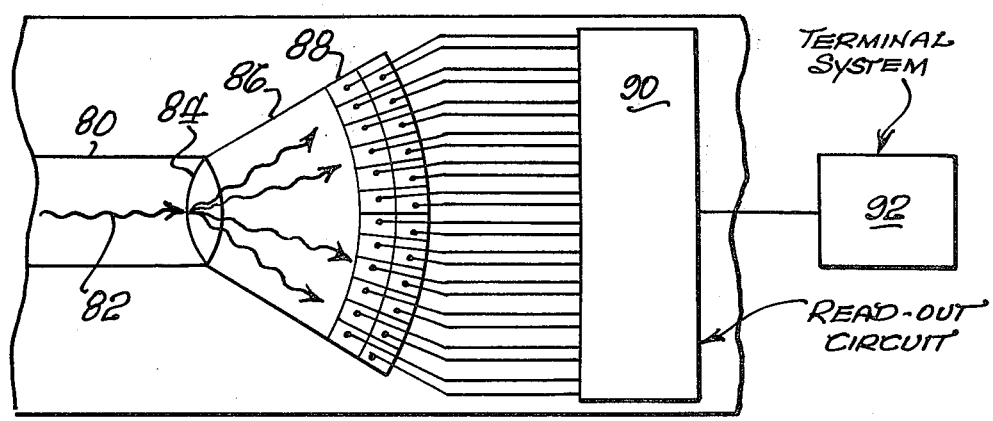
FIG. 5 is a schematic representation of an integrated optical system utilizing the photodetector array of the present invention.

The inherent advantages of the array 70 are perhaps best illustrated in an integrated optical system such as shown in FIG. 5. A thin film optical wave guide 80 transmits the light beam 82 to a thin film lens 84 which disperses the beam into a second wave guide 86. The thin film detector array 88 is located at the periphery of the waveguide 86 such that the distribution of the beam is monitored. The readings by the detector array 88 can be monitored by additional integrated read-out circuitry 90 within the thin film device structure or by electrical attachment to other devices in a hybrid structure. In either event, a terminal system 92 is employed to utilize or display the detector signals.

Since the semiconductor film is only locally sensitized, the photoconductive region of each cell is defined by that specific geometric area. The resistance between the electrode pads is dominated by the relatively high resistance of this sensitized region. Accordingly the exact placement of the electrode pads is not critical as had been the case in the prior art cells. Small changes in the electrode pad placement can now be tolerated without seriously affecting the sensitivity or uniformity of the array. The relaxed tolerances, in addition to producing a high uniformity of electrical response over the entire array, enables significant savings in manufacturing costs and greater reproducibility.

While specific embodiments of the invention and particular procedures for carrying out the inventive processes have been illustrated and described, it is intended that these are provided by way of example only, the spirit and scope of this invention being limited only by the proper scope of the appended claims.

What I claim is:

1. A method of manufacturing a photoconductive array cell comprising the steps of:
    depositing a thin film of photosensitizable semiconductor material on an insulative material substrate;
    diffusing an impurity into a defined portion of said photosensitizable thin film to photosensitize said defined region;
    depositing thin film metal electrode pads on said photosensitizable thin film around the photosensitized portion of said photosensitizable thin film, with said photosensitized portion being noncontiguous with said electrode pads defining only a small portion of the area between said electrode pads; and
    bonding a metal wire lead to each of said electrode pads.

2. The method of claim 1 wherein said thin film of photosensitizable semiconductor material is cadmium sulfide.

3. The method of claim 1 wherein said impurity is copper.

4. The method of claim 1 wherein said insulative material substrate is plate glass.

5. The method of claim 1 wherein the defined portion of said thin film that is photosensitized is a narrow band between said electrode pads.

6. A method of manufacturing a photoconductive array comprising the steps of:
    depositing a thin film of photosensitizable semiconductor material on an insulative material substrate;
    depositing a pair of spaced-apart electrode pads on said photosensitizable thin film;
    diffusing an impurity into a small portion of said photosensitizable thin film between said pair of spaced-apart electrode pads to photosensitize said small portion, said photosensitized portion being spaced apart from said electrodes; and
    bonding a metal wire lead to each of said electrode pads.

7. A method of manufacturing a photoconductive array comprising the steps of:
    depositing a thin film of photosensitizable material on an insulative material substrate;
    diffusing an impurity into a plurality of substantially parallel narrow bands of said thin film to photosensitize said narrow bands;
    depositing on said thin film a plurality of electrode pads, said electrode pads disposed substantially parallel to said photosensitized narrow bands with one electrode pad disposed on either side of each band and spaced apart therefrom; and
    bonding a metal wire lead to each of said electrode pads.

* * * * *